United States Patent
Chang et al.

(10) Patent No.: US 11,063,003 B2
(45) Date of Patent: Jul. 13, 2021

(54) SEMICONDUCTOR DEVICE WITH DICED SEMICONDUCTOR CHIPS AND METHOD FOR MANUFACTURING THE SAME

(71) Applicant: NANYA TECHNOLOGY CORPORATION, New Taipei (TW)

(72) Inventors: Ching-Hung Chang, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/149,888

(22) Filed: Oct. 2, 2018

(65) Prior Publication Data

US 2020/0105681 A1    Apr. 2, 2020

(51) Int. Cl.
*H01L 23/00* (2006.01)
*H01L 21/82* (2006.01)

(52) U.S. Cl.
CPC ............ *H01L 23/562* (2013.01); *H01L 21/82* (2013.01)

(58) Field of Classification Search
CPC ............................. H01L 23/562; H01L 21/82
See application file for complete search history.

(56) References Cited

U.S. PATENT DOCUMENTS

| 6,743,699 | B1 * | 6/2004 | Doan ...................... H01L 21/56 257/E21.502 |
| 2007/0155055 | A1 | 7/2007 | Yang |
| 2007/0262424 | A1 | 11/2007 | Hiatt |
| 2012/0139125 | A1 * | 6/2012 | Kang ...................... H01L 25/03 257/774 |
| 2013/0082304 | A1 * | 4/2013 | Liu ...................... H01L 29/7848 257/192 |
| 2014/0151701 | A1 * | 6/2014 | Fuergut ................... H01L 21/56 257/48 |
| 2015/0162243 | A1 * | 6/2015 | Kumar ................ H01L 21/3043 438/462 |
| 2018/0294202 | A1 * | 10/2018 | Cheng ................... H01L 23/564 |

FOREIGN PATENT DOCUMENTS

| CN | 101123217 A | 2/2008 |
| CN | 101159260 A | 4/2008 |
| CN | 103035713 A | 4/2013 |
| CN | 103848391 A | 6/2014 |
| TW | 20122788 A1 | 7/2012 |
| TW | 201301414 A1 | 1/2013 |
| TW | 201312697 A1 | 3/2013 |

* cited by examiner

*Primary Examiner* — Thao X Le
*Assistant Examiner* — Xia L Cross
(74) *Attorney, Agent, or Firm* — Muncy, Geissler, Olds & Lowe, P.C.

(57) ABSTRACT

The present disclosure provides a semiconductor device. The semiconductor device includes a semiconductor wafer, a plurality of semiconductor chips, and a plurality of first protection dams. The semiconductor wafer has a plurality of functional regions separated by a plurality of vertical streets and a plurality of horizontal streets. The semiconductor chips are mounted on the functional regions, respectively. The first protection dams are disposed on the vertical streets and the horizontal streets and spaced from the semiconductor chips. A height of the first protection dam is not less than a height of the semiconductor chip.

8 Claims, 20 Drawing Sheets

SEMICONDUCTOR DEVICE WITH DICED SEMICONDUCTOR CHIPS AND METHOD FOR MANUFACTURING THE SAME

TECHNICAL FIELD

The present disclosure relates to a semiconductor device and method for manufacturing the same, and more particularly, to a semiconductor wafer to be diced that has a plurality of semiconductor chips and a method for manufacturing the same.

DISCUSSION OF THE BACKGROUND

Semiconductor devices are essential for many modern applications. With the advancement of electronic technology, semiconductor devices are steadily becoming smaller in size while providing greater functionality and including greater amounts of integrated circuitry. Due to the miniaturized scale of semiconductor devices, wafer level chip scale package (WLCSP) is widely used for manufacturing.

WLCSP is a thinner chip package formed without a substrate or molding compound to be protected, and thus is prone to chip chipping or cracking during the handling and assembly processes, thereby raising reliability issues.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device comprises a semiconductor wafer, a plurality of semiconductor chips, and a plurality of first protection dams. The semiconductor wafer has a plurality of functional regions separated by a plurality of vertical streets and a plurality of horizontal streets. Each of the plurality of semiconductor chips is mounted on the functional regions, respectively. The first protection dams are disposed on the vertical streets and the horizontal streets and spaced from the semiconductor chips. A height of the first protection dam is not less than a height of the semiconductor chip.

In some embodiments, a distance from a sidewall of the semiconductor chip to an outer surface of the first protection dam, away from the semiconductor chip, is less than 10 µm.

In some embodiments, a thickness of the first protection dam is substantially equal to 4 µm.

In some embodiments, the distance from the sidewall of the semiconductor chip to the outer surface of the first protection dam is not less than 1 µm.

In some embodiments, the first protection dams surround each of the semiconductor chips, respectively.

In some embodiments, the first protection dams are disposed at corners of the semiconductor chips, and each of the first protection dams comprises a vertical segment, a horizontal segment, and an intersection segment; the vertical segment is disposed on the vertical street, the horizontal segment is disposed on the horizontal street, and the intersection segment is disposed at an intersection point of the vertical segment and the horizontal segment.

In some embodiments, the vertical segment and the horizontal segment are partially superposed with the semiconductor chip as seen in side views of the semiconductor wafer.

In some embodiments, the vertical segment, the horizontal segment, and the intersection segment are integrally formed.

In some embodiments, the semiconductor device further comprises a plurality of second protection dams disposed on the vertical streets and the horizontal streets and between two adjacent vertical segments and two adjacent horizontal segments.

In some embodiments, the second protection dam is at least partially superposed with the semiconductor chip as seen in side views of the semiconductor wafer.

In some embodiments, the vertical segment and the horizontal segment are not superposed with the semiconductor chip as seen in side views of the semiconductor wafer.

In some embodiments, a distance between a sidewall of the semiconductor chip and a surface of the second protection dam, away from the semiconductor chip, is substantially less than 10 µm.

In some embodiments, the distance from the sidewall of the semiconductor chip to the outer surface of the second protection dam is not less than 1 µm.

In some embodiments, a height of the second protection dams is not less than the height of the semiconductor chips.

In some embodiments, a height of the first protection dams is different from the height of the second protection dams.

In some embodiments, a thickness of the second protection dam is substantially equal to 4 µm.

In some embodiments, the first protection dams and the second protection dams are integrally formed.

In some embodiments, a material of the first protection dams and the second protection dams is consistent.

Another aspect of the present disclosure provides a method for manufacturing a semiconductor device. The mothed includes steps of providing a semiconductor substrate; providing a semiconductor structure on a surface of the semiconductor substrate, wherein the semiconductor substrate comprises a plurality of active area and a plurality of inactive area; forming a plurality of openings in the inactive areas, wherein the openings are spaced from the active areas; and filling a protection layer in the openings.

In some embodiments, the step of filling the protection layer in the opening includes steps of depositing the protection layer in a top surface of the semiconductor structure and in the opening; and removing a portion of the protection layer to expose the top surface.

With the above-mentioned configurations of semiconductor device, the corners and/or edges of the semiconductor chip are protected by the first protection dams and/or the second protection dams, thus preventing cracking of the semiconductor chip during the handling or assembly processes.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
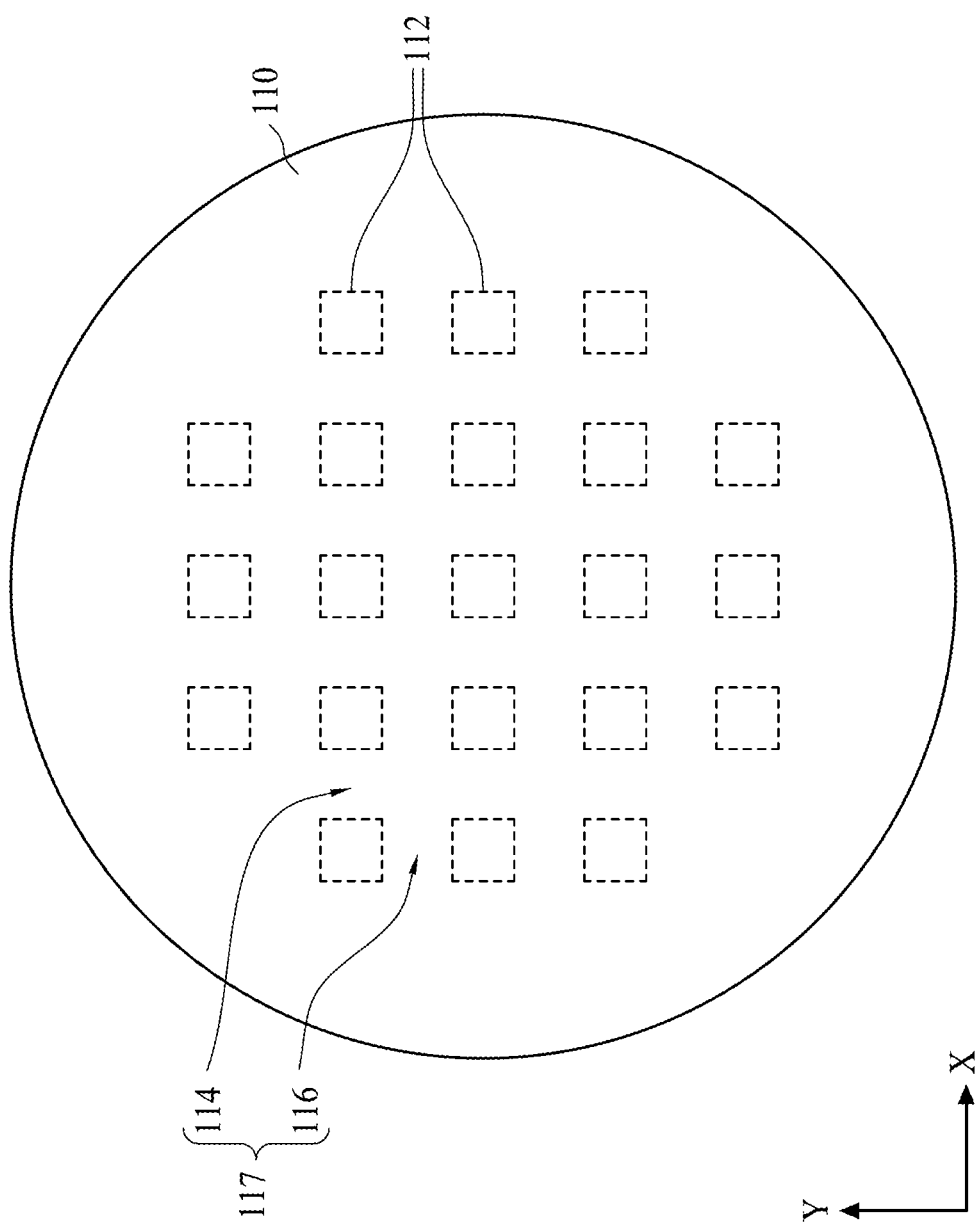
FIG. 1 is a top view of a semiconductor wafer to be diced in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a top view of a semiconductor wafer 110 to be diced in accordance with some embodiments of the present disclosure. Referring to FIG. 1, the semiconductor wafer 110 has a plurality of regions 112 that include a plurality of integrated circuits or semiconductor chips, depending on the application. The regions 112 are separated by a plurality of vertical streets 114 and a plurality of horizontal streets 116.

In some embodiments, the regions 112 are arranged at regular intervals in a vertical direction X and a horizontal direction Y. In some embodiments, the vertical streets 114 and the horizontal streets 116 are non-functional regions 117 of the semiconductor wafer 110, while the regions 112 for mounting the integrated circuits or the semiconductor chips are functional regions. In some embodiments, the vertical streets 114 and the horizontal streets 116 are regions of the semiconductor wafer 110 that do not contain integrated circuits or semiconductor chips. In some embodiments, the vertical streets 114 and the horizontal streets 116 are formed between the regions 112 to define the regions that will be sawed during a sawing process to dice the semiconductor wafer 110. In some embodiments, the vertical streets 114 and the horizontal streets 116 provide cutting regions to singulate the semiconductor wafer 110 into individual integrated circuits or semiconductor chips. In some embodiments, the semiconductor wafer 110 is singulated using a laser cutting tool or saw blade. In some embodiments, the semiconductor wafer 110 is a silicon wafer.

Figure 2:
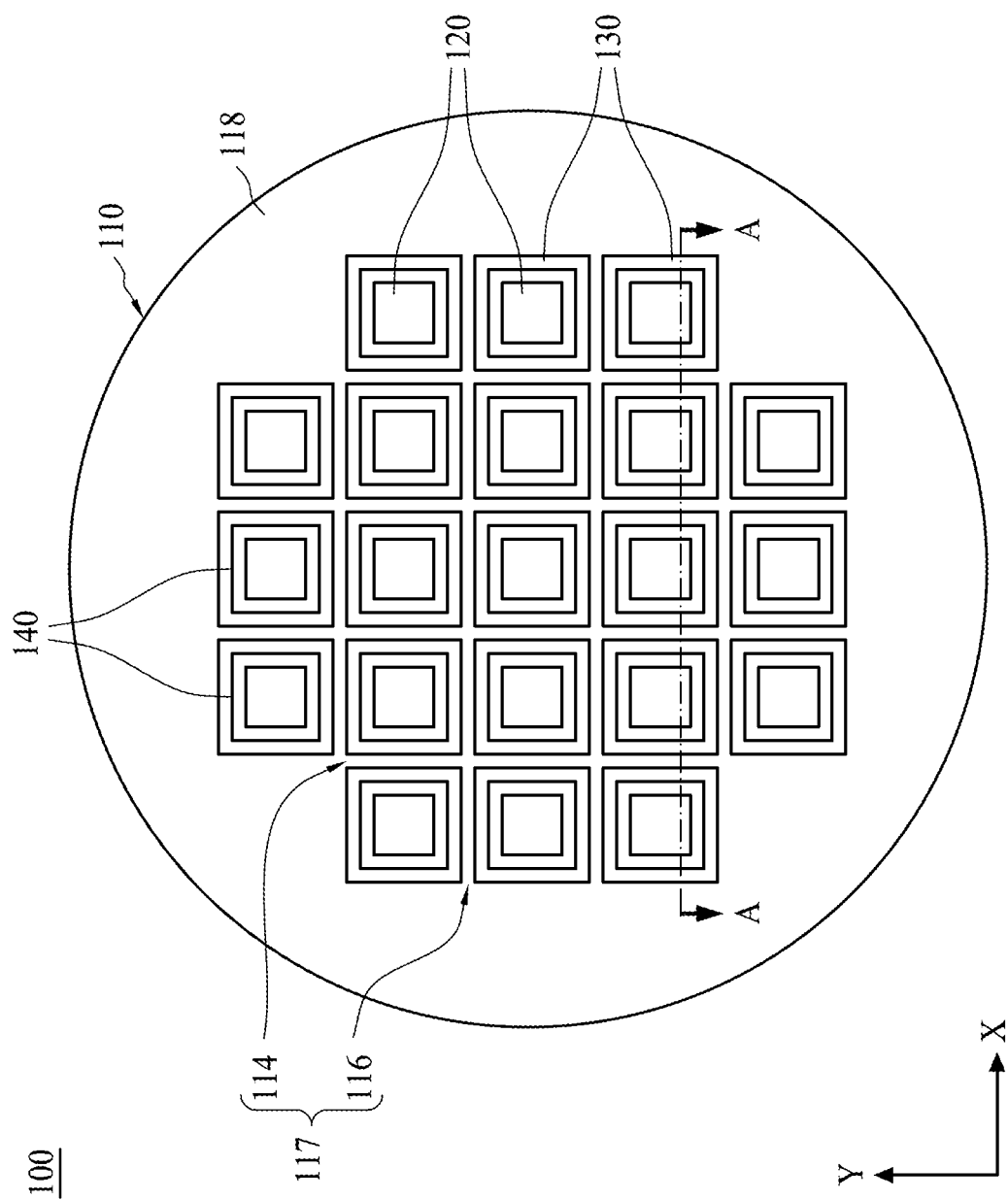
FIG. 2 is a top view of a semiconductor device in accordance with some embodiments of the present disclosure.
Figure 3:
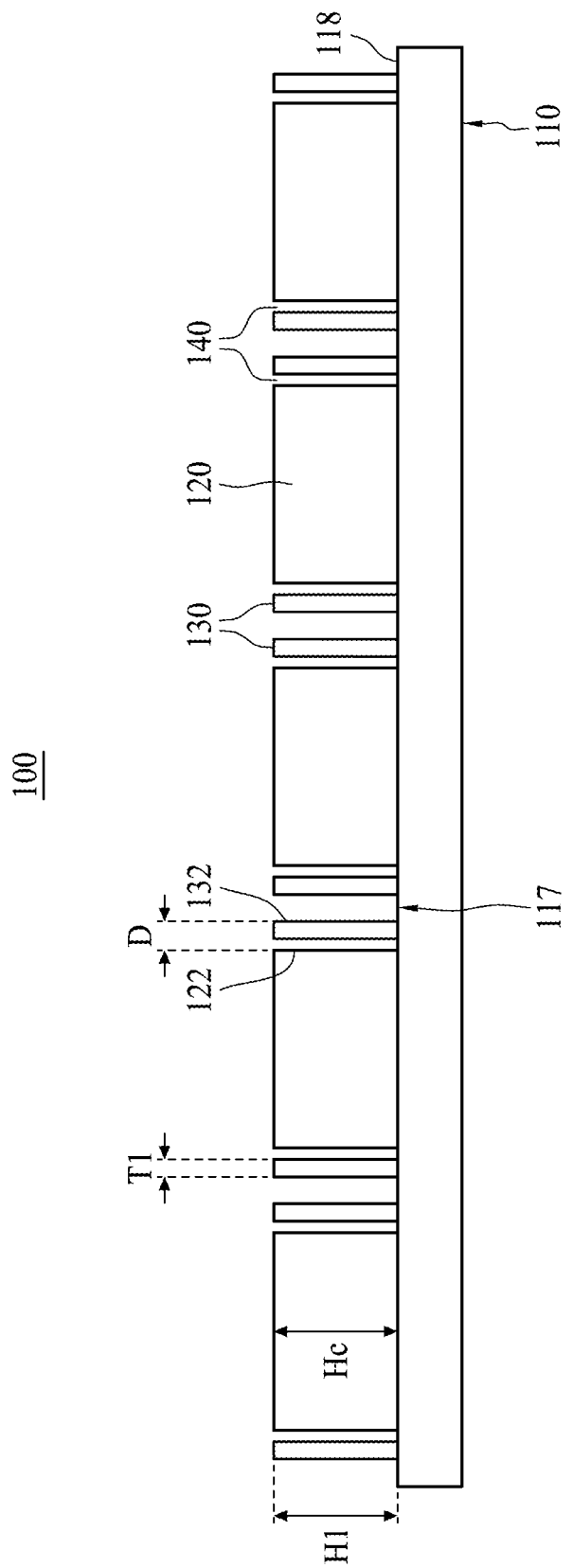
FIG. 3 is a cross-sectional view of the semiconductor device in accordance with some embodiments of the present disclosure.

FIG. 2 is a top view of semiconductor device 100 in accordance with some embodiments of the present disclosure. FIG. 3 is a cross-sectional view of the semiconductor device 100 in accordance with some embodiments of the present disclosure. Referring to FIGS. 2 and 3, in some embodiments, a semiconductor device 100 includes a semiconductor wafer 110, a plurality of semiconductor chips 120 mounted on the semiconductor wafer 110, and a plurality of first protection dams 130 disposed on the semiconductor wafer 110 and at a perimeter of the semiconductor chips 120.

Specifically, the semiconductor wafer 110 may be implemented using the semiconductor wafer described with respect to FIG. 1. The semiconductor chips 120 are mounted on a surface 118 of the semiconductor wafer 110 and located at the regions 112 shown in FIG. 1, respectively. In some embodiments, each first protection dam 130 is disposed on the non-functional regions 117 of the semiconductor wafer 110, and an air gap 140 exists between the semiconductor chip 120 and the first protection dam 130 for protecting the semiconductor chip 120 during the handling or assembly processes. In some embodiments, the first protection dam 130 surrounds the semiconductor chip 120.

In some embodiments, the semiconductor chips 120 mounted on the regions 112 of the semiconductor wafer 110 contain one or more semiconductor structure. The one or more semiconductor structures are formed over the surface 118 of the semiconductor wafer 110 by a series of process steps including doping, deposition, photolithography, etching, and planarization.

Figure 4:
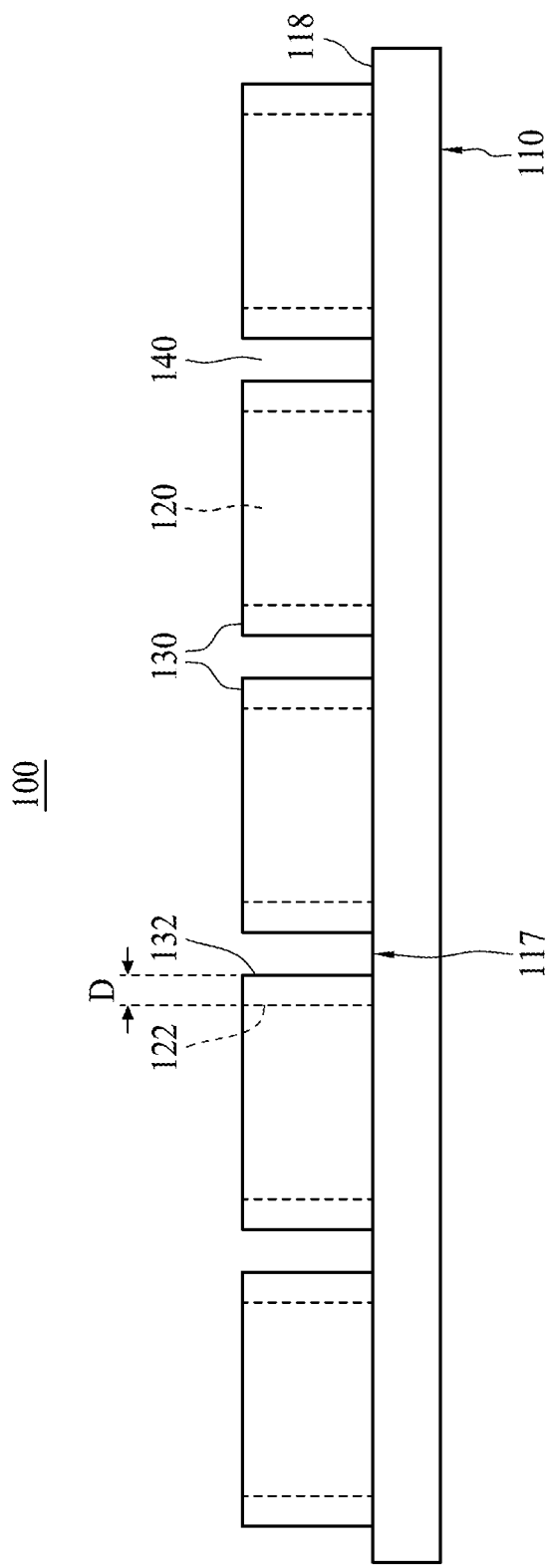
FIG. 4 is a side view of a semiconductor device in accordance with some embodiments of the present disclosure.

In some embodiments, the first protection dam 130 is formed by an organic material. In some embodiments, the first protection dam 130 is formed by polyimide. In some embodiments, a thickness T1 of the first protection dam 130 is substantially equal to 4 μm, as shown in FIG. 3. In some embodiments, a distance D between a sidewall 122 of the semiconductor chip 120 to an outer surface 132 of the first protection dam 130, away from the semiconductor chip 120, as shown in FIG. 3 and FIG. 4, is substantially equal to or less than 10 μm. In some embodiments, the distance D between the sidewall 122 of the semiconductor chip 120 to the outer surface 132 of the first protection dam 130, away from the semiconductor chip 120 is not less than 1 μm. In some embodiments, a height H1 of the first protection dam 130 is not less than a height Hc of the semiconductor chip 120, as shown in FIG. 3. In some embodiments, the height H1 of the first protection dam 130 is substantially equal to the height Hc of the semiconductor chip 120. In some embodiments, the first protection dam 130 functions as a chip-sawing crack stopper.

In some embodiments, the first protection dam 130 is formed in situ during the formation of the active and/or passive components of the semiconductor chip 120. As used herein, the term "in-situ" is used to describe processes that are performed while the semiconductor wafer 110 that has the semiconductor chips 120 remains within a processing system (e.g., including a load lock chamber, transfer chamber, processing chamber, or any other fluidly coupled chamber), and where, for example, the processing chamber allows the semiconductor wafer 110 to remain under vacuum conditions. As such, the term "in-situ" may also generally be used to refer to processes in which the semiconductor wafer 110 being processed is not exposed to an external ambient (e.g., external to the processing system) environment.

Figure 5:
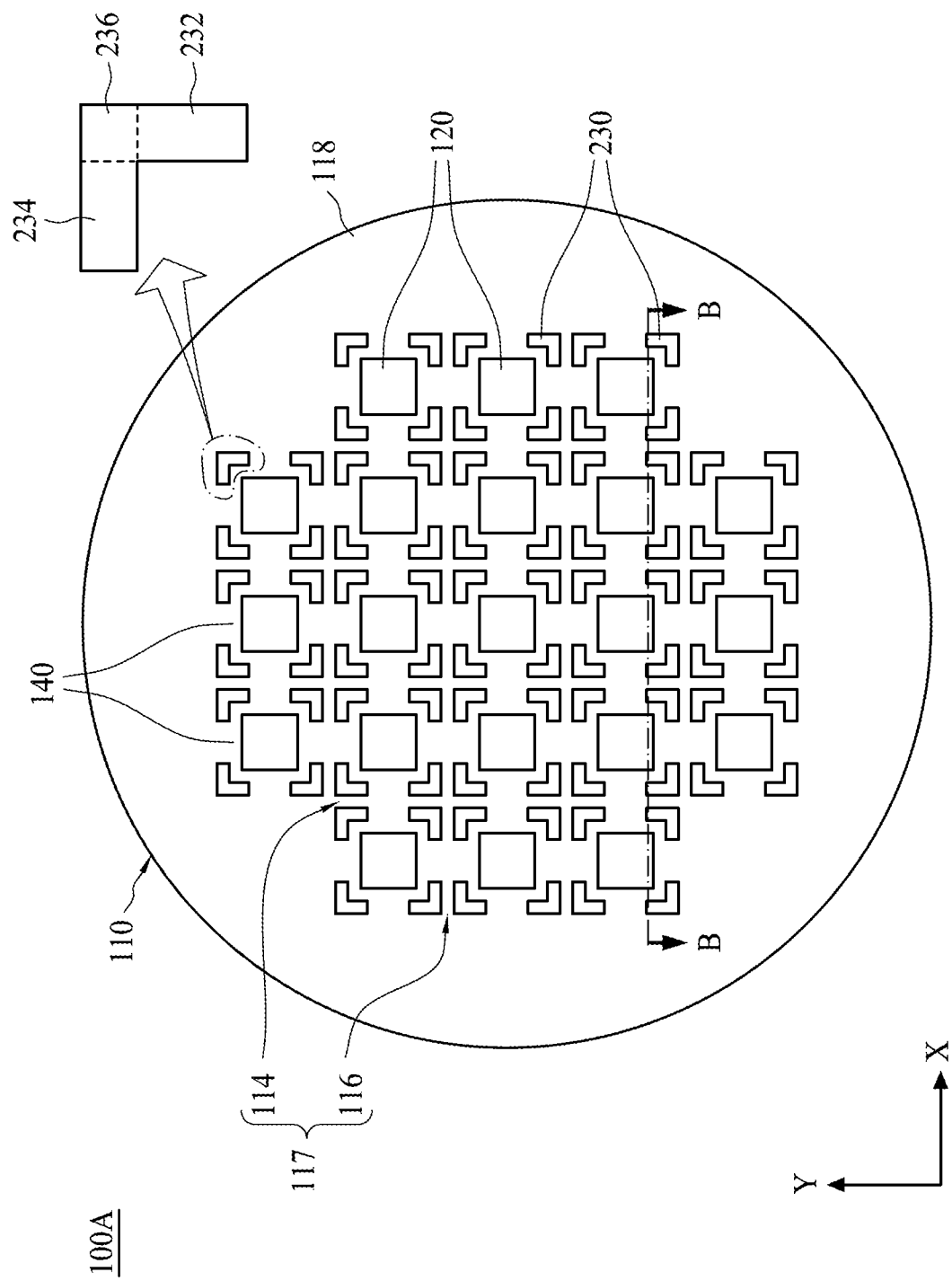
FIG. 5 is a top view of a semiconductor device in accordance with some embodiments of the present disclosure.

FIG. 5 is a top view of a semiconductor device 100A in accordance with some embodiments of the present disclosure. Referring to FIG. 5, in some embodiments, the semiconductor device 100A includes a semiconductor wafer 110, a plurality of semiconductor chips 120, and a plurality of first protection dams 230. The semiconductor wafer 110 may be implemented using the semiconductor wafer described with respect to FIG. 1. The semiconductor chips 120 are mounted on a surface 118 of the semiconductor wafer 110 and located at the functional regions 112 shown in FIG. 1, respectively. In some embodiments, the first protection dams 230 are disposed on non-functional regions 117 including the vertical streets 114 and the horizontal streets 116 of the semiconductor wafer 110 and at corners of the semiconductor chips 120 for protecting the semiconductor chip 120 during handling or assembly processes. In some embodiments, the first protection dams 230 are not in contact with the semiconductor chip 120; in other words, air gaps 240 exist between the semiconductor chip 120 and the first protection dams 230.

Figure 6:
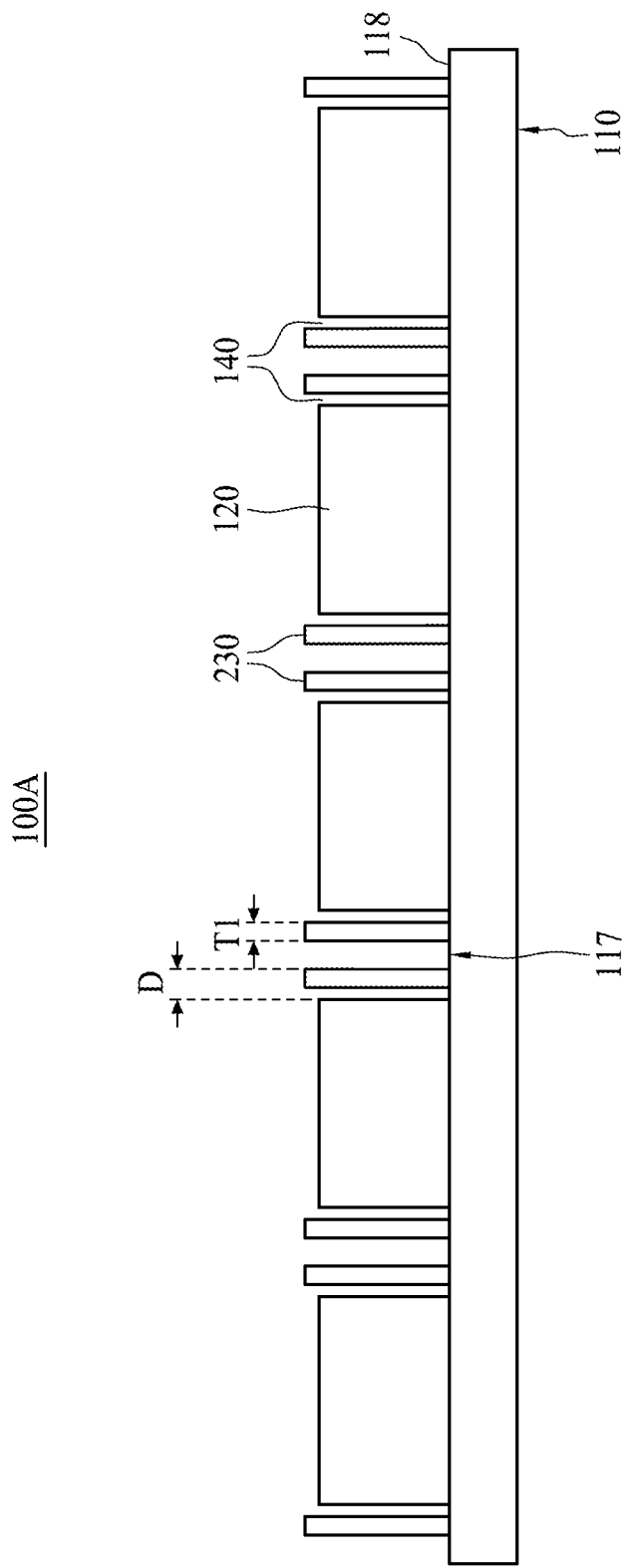
FIG. 6 is a cross-sectional view of the semiconductor device in accordance with some embodiments of the present disclosure.

In some embodiments, the semiconductor chip 120 includes four sidewalls and the corners coupling adjacent sidewalls. In some embodiments, the first protection dam 230 has a vertical segment 232 disposed on the vertical streets 114, a horizontal segment 234 disposed on the horizontal streets 116, and an intersection segment 236 formed at an intersection point of the vertical segment 232 and the horizontal segment 234. In some embodiments, the vertical segment 232, the horizontal segment 234, and the intersection segment 236 are integrally formed. In some embodiments, a thickness T1 of the vertical segment 232 of the first protection dam 130, as shown in FIG. 6, is substantially equal to 4 μm; similarly, a thickness of the horizontal segment 234 of the first protection dam 230 is 4 μm, and a thickness of the intersection segment 236 is substantially equal to 4 μm.

Figure 7:
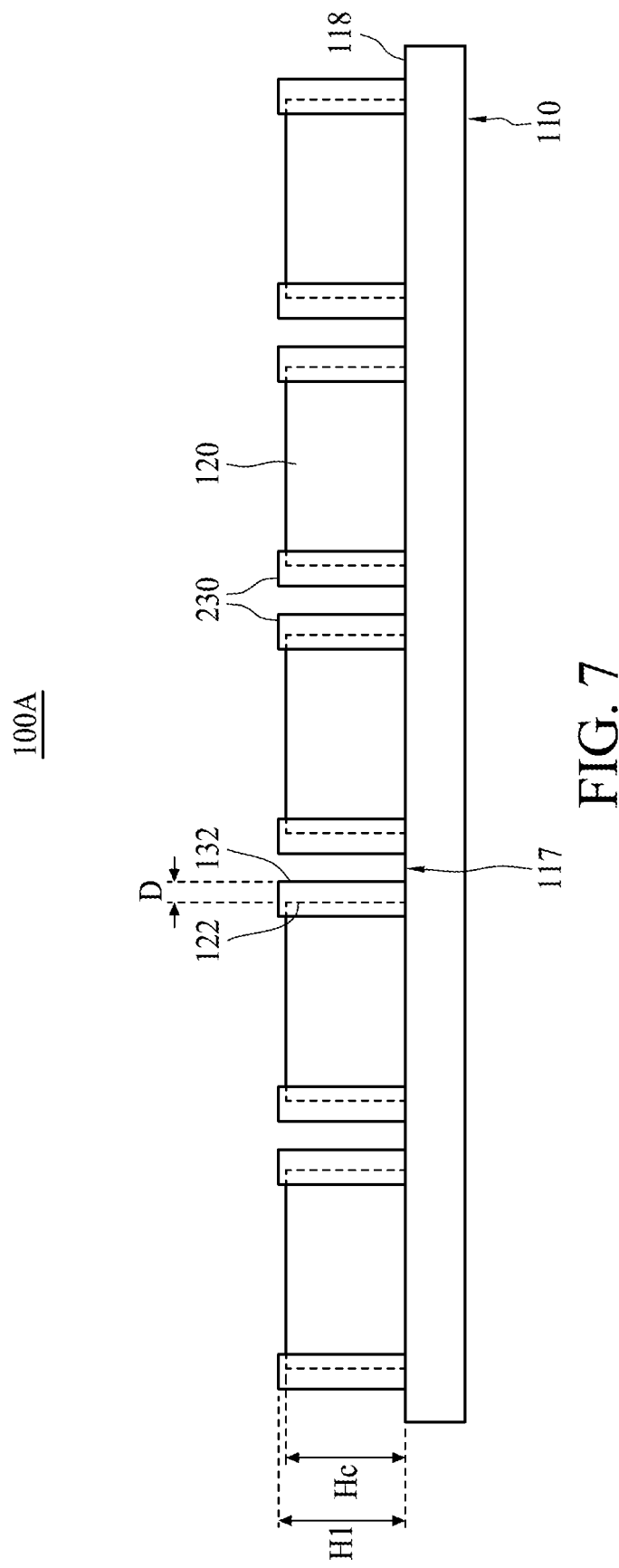
FIG. 7 is a side view of the semiconductor device in accordance with some embodiments of the present disclosure.

In some embodiments, the vertical segment 232 of the first protection dam 230 is partially superposed with the semiconductor chip 120 as seen in a side view of the semiconductor wafer 110, as shown in FIG. 7, similarly, the horizontal segment 234 of the first protection dam 230 is partially superposed with the semiconductor chip 120 as seen in another side view of the semiconductor wafer 110. In some embodiments, a distance D between a sidewall 122 of the semiconductor chip 120 to an outer surface 132 of the first protection dam 130, away from the semiconductor chip 120, as shown in FIG. 6 and FIG. 7, is substantially equal to or less than 10 μm. In some embodiments, the distance D between the sidewall 12 of the semiconductor chip 120 to the outer surface 132 of the first protection dam 130, away from the semiconductor chip 120 is not less than 1 μm. In some embodiments, the first protection dam 130 functions as a chip-sawing crack stopper. In some embodiments, the first protection dam 130 is formed by polyimide.

Figure 8:
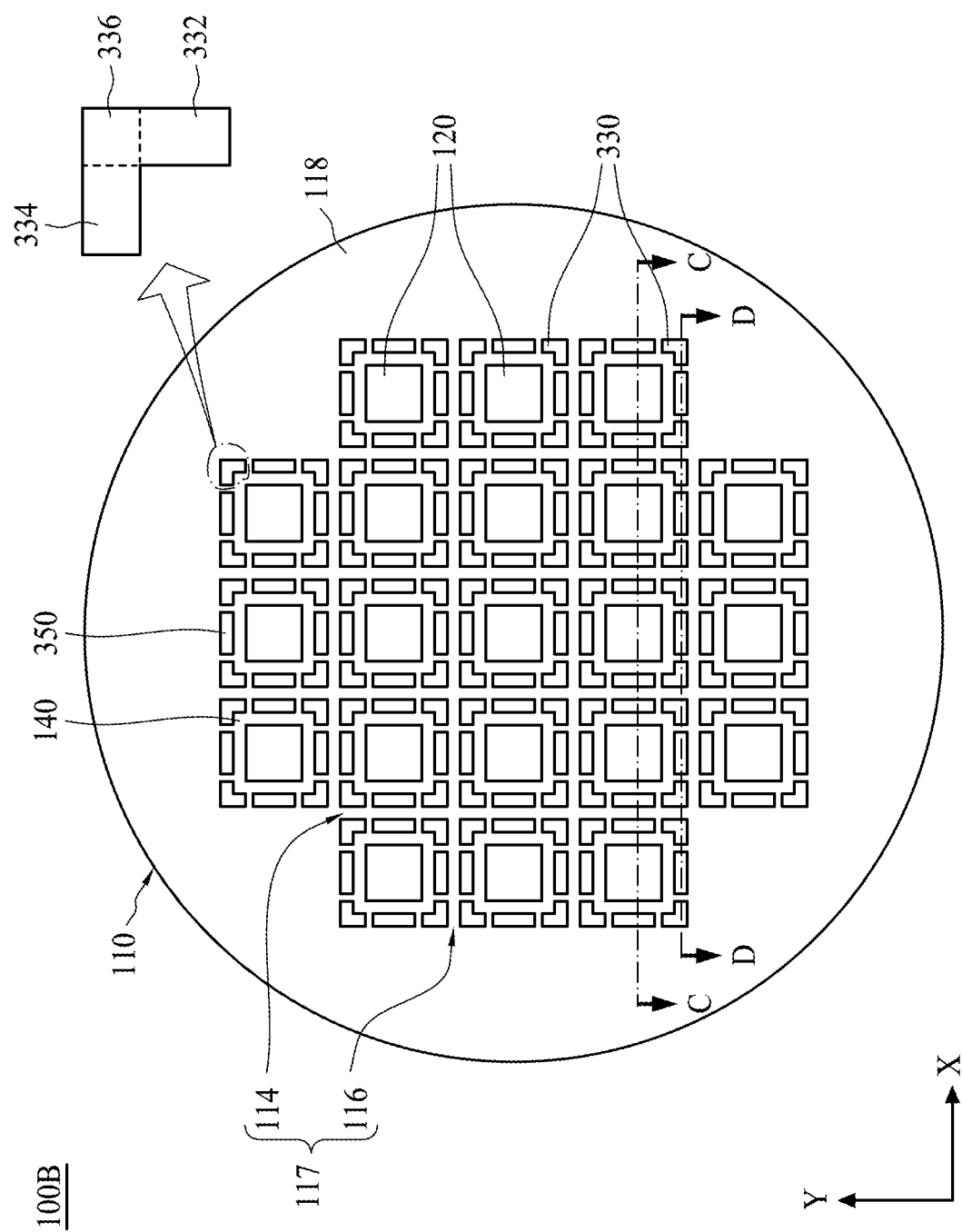
FIG. 8 is a top view of a semiconductor device in accordance with some embodiments of the present disclosure.

FIG. 8 is a top view of a semiconductor device 100B in accordance with some embodiments of the present disclosure. Referring to FIG. 8, in some embodiments, the semiconductor device 100B includes a semiconductor wafer 110, a plurality of semiconductor chips 120, a plurality of first protection dams 330, and a plurality of second protection dams 350. The semiconductor wafer 110 may be implemented using the semiconductor wafer described with respect to FIG. 1. The semiconductor chips 120 are mounted on a surface 118 of the semiconductor wafer 110 and located at the functional regions 112 shown in FIG. 1, respectively. In some embodiments, the first protection dams 330 and the second protection dams 350 are disposed on non-functional regions 117 of the semiconductor wafer 110. In some embodiments, the first protection dams 330 are disposed at corners of the semiconductor chips 120, and the second protection dams 350 are disposed on a perimeter of the semiconductor chips 120 for protecting the semiconductor chip 120 during handling or assembly processes. In some embodiments, the first protection dams 330 and the second protection dams 350 are not in contact with the semiconductor chip 120; in the other words, air gaps 340 exist between the semiconductor chip 120, the first protection dams 330 and the second protection dams 350.

Figure 9:
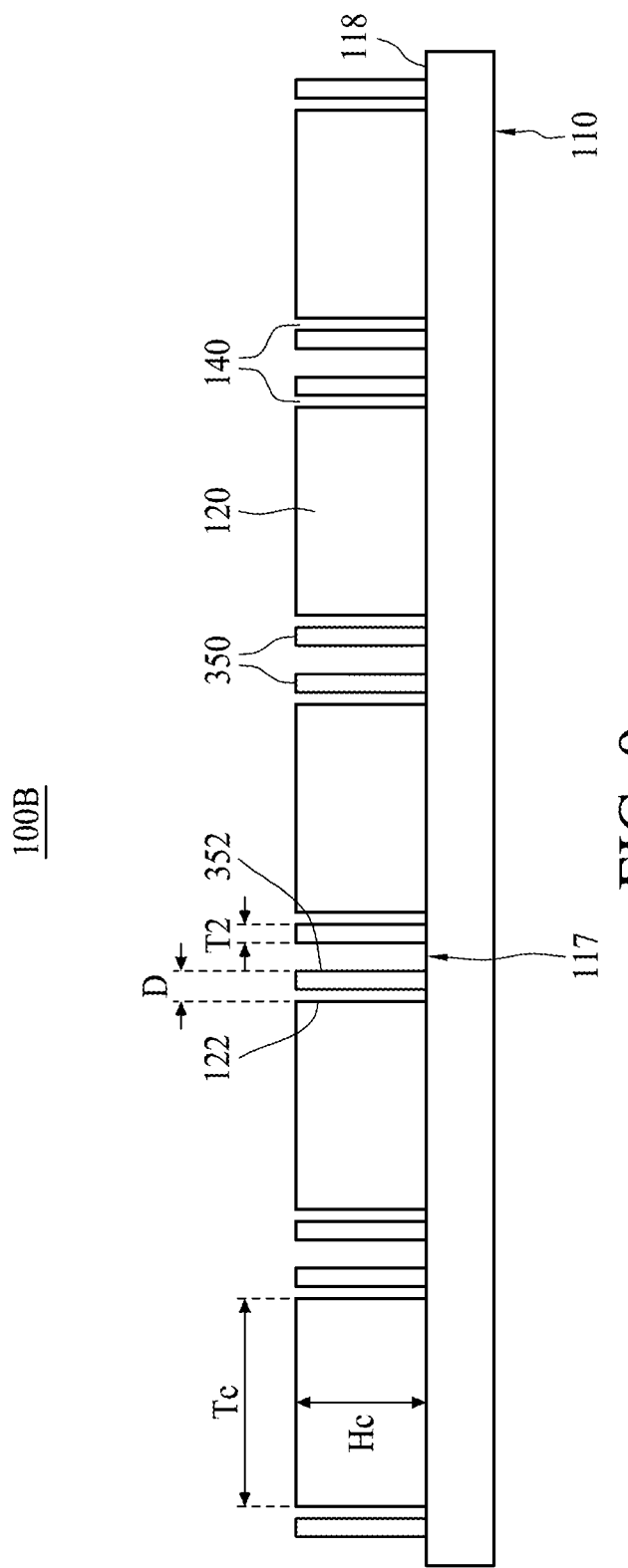
FIG. 9 is a cross-sectional view of the semiconductor device in accordance with some embodiments of the present disclosure.

In some embodiments, the first protection dam 330 has a vertical segment 332 disposed on the vertical street 114, a horizontal segment 334 disposed on the horizontal street 116, and an intersection segment 336 formed at an intersection point of the vertical segment 332 and the horizontal segment 334. In some embodiments, the vertical segment 332, the horizontal segment 334, and the intersection segment 336 are integrally formed. In some embodiments, a thickness T1 of the vertical segment 232 of the first protection dam 130, as shown in FIG. 9, is substantially equal to 4 μm; similarly, a thickness of the horizontal segment 234 of the first protection dam 230 is substantially equal to 4 μm, and a thickness of the intersection segment 236 is substantially equal to 4 µm. In some embodiments, a thickness T1 of the first protection dam 330 is substantially less than a thickness Tc of the semiconductor chip 120.

In some embodiments, a distance D from a sidewall 122 of the semiconductor chip 120 to an outer surface 332 of the first protection dam 330, away from the semiconductor chip 120, as shown in FIG. 9, is substantially equal to or less than 10 µm. In some embodiments, the distance D between the sidewall 122 of the semiconductor chip 120 to the outer surface 352 of the second protection dam 350, away from the semiconductor chip 120 is not less than 1 µm.

Figure 10:
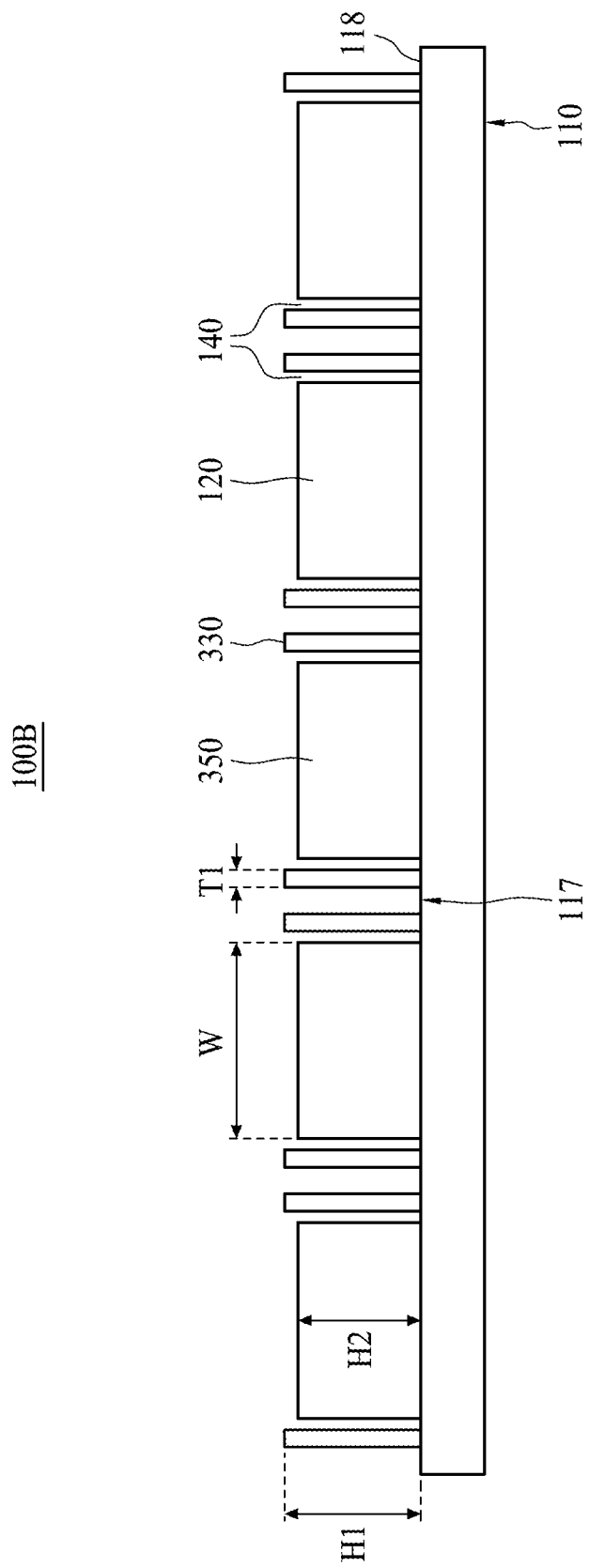
FIG. 10 is a cross-sectional view of the semiconductor device in accordance with some embodiments of the present disclosure.
Figure 11:
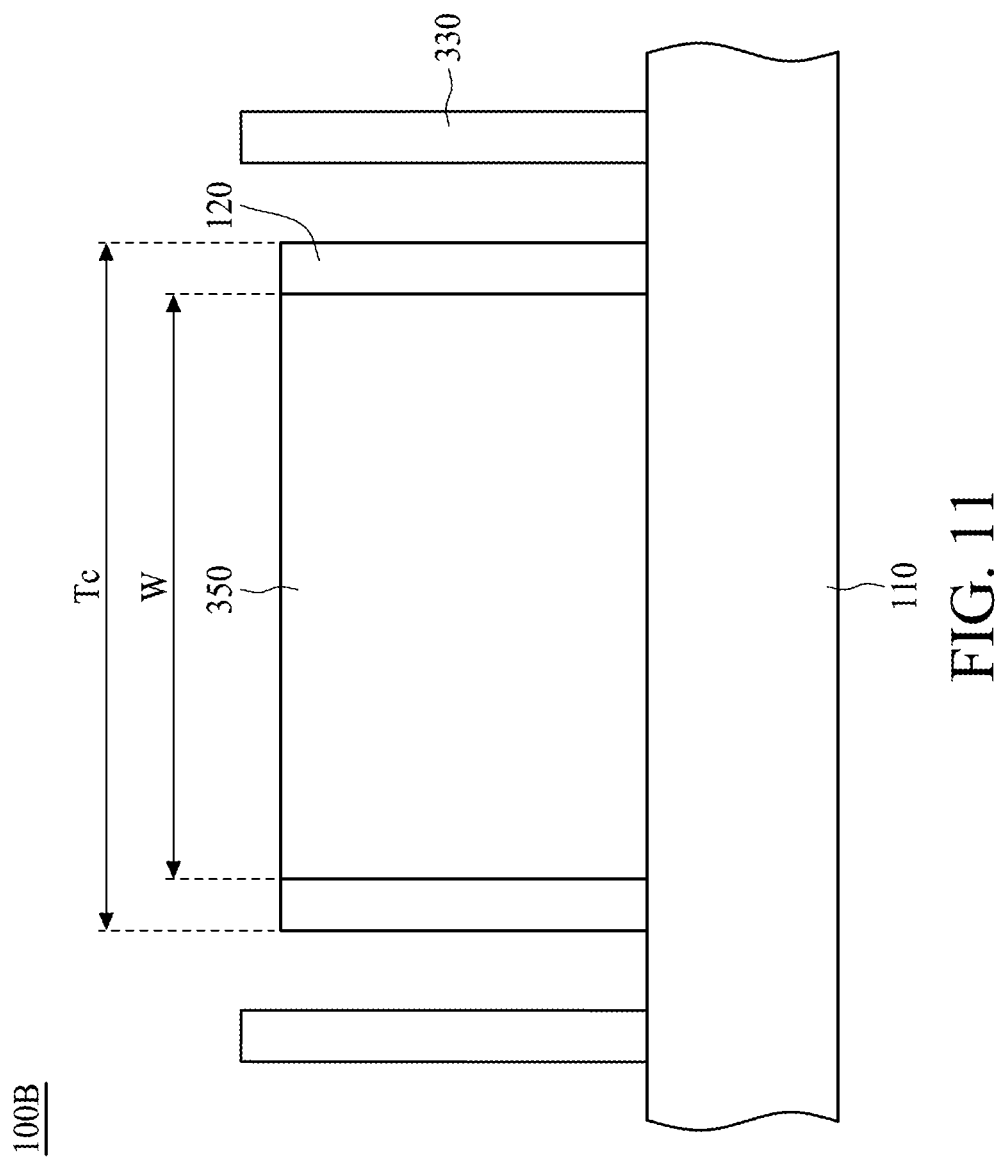
FIG. 11 is a partially side view of the semiconductor device in accordance with some embodiments of the present disclosure.

In some embodiments, a height H2 of the second protection dams 350 is different from a height H1 of the first protection dams 330. In some embodiments, the height H2 of the second protection dams 350 is not less than a height Hc of the semiconductor chip 120. In some embodiments, the height H2 of the second protection dams 350 is substantially equal to the height Hc of the semiconductor chip 120, as shown in FIG. 9. In some embodiments, the height H1 of the first protection dams 330 is substantially greater than the height H2 of the second protection dams 350, as shown in FIG. 10.

In some embodiments, the vertical segment 332 of the first protection dam 330 is not superposed with the semiconductor chip 120 as seen in a side view of the semiconductor wafer 110; similarly, the horizontal segment 334 of the first protection dam 330 is not superposed with the semiconductor chip 120 as seen in another side view of the semiconductor wafer 110. In some embodiments, a width W of the second protection dam 350 is not greater than a width of the semiconductor chip 120. In some embodiments, the second protection dam 350 is superposed with the semiconductor chip 120 as seen in a side view of the semiconductor wafer 110.

In some embodiments, the first protection dams 330 and the second protection dams 350 function as a chip-sawing crack stopper. In some embodiments, the first protection dams 330 and the second protection dams 350 are made of the same material. In some embodiments, the first protection dams 330 and the second protection dams 350 are formed by polyimide. In some embodiments, the first protection dams 330 and the second protection dams 350 are integrally formed.

Figure 12:
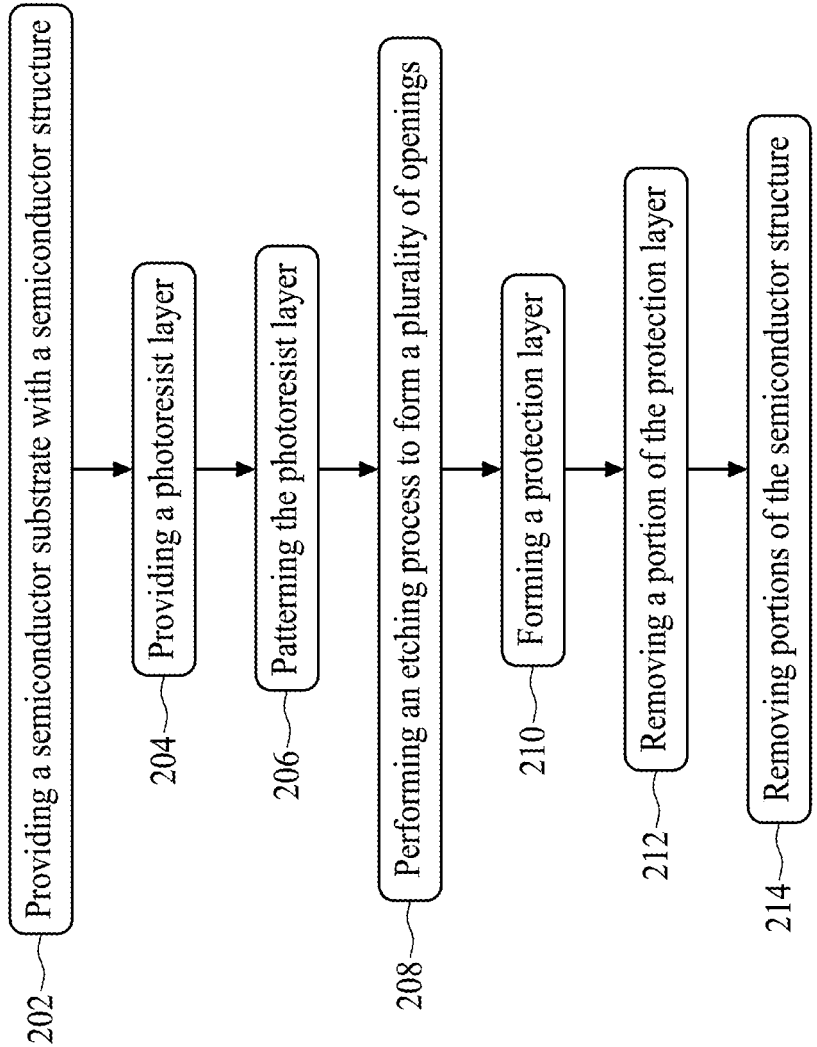
FIG. 12 is a flow diagram illustrating a method for manufacturing semiconductor devices, in accordance with some embodiments of the present disclosure.

FIG. 12 is a flow diagram 200 illustrating a method for manufacturing semiconductor devices 100, in accordance with some embodiments of the present disclosure. FIGS. 13 to 20 are schematic diagrams illustrating various fabrication stages constructed according to the method for manufacturing the semiconductor device 100 in accordance with some embodiments of the present disclosure. The steps shown in FIGS. 13 through 20 are also illustrated schematically in the process flow shown in FIG. 12. In the subsequent discussion, the process steps shown in FIGS. 13 through 20 are discussed in reference to the process steps in FIG. 13.

Figure 13:
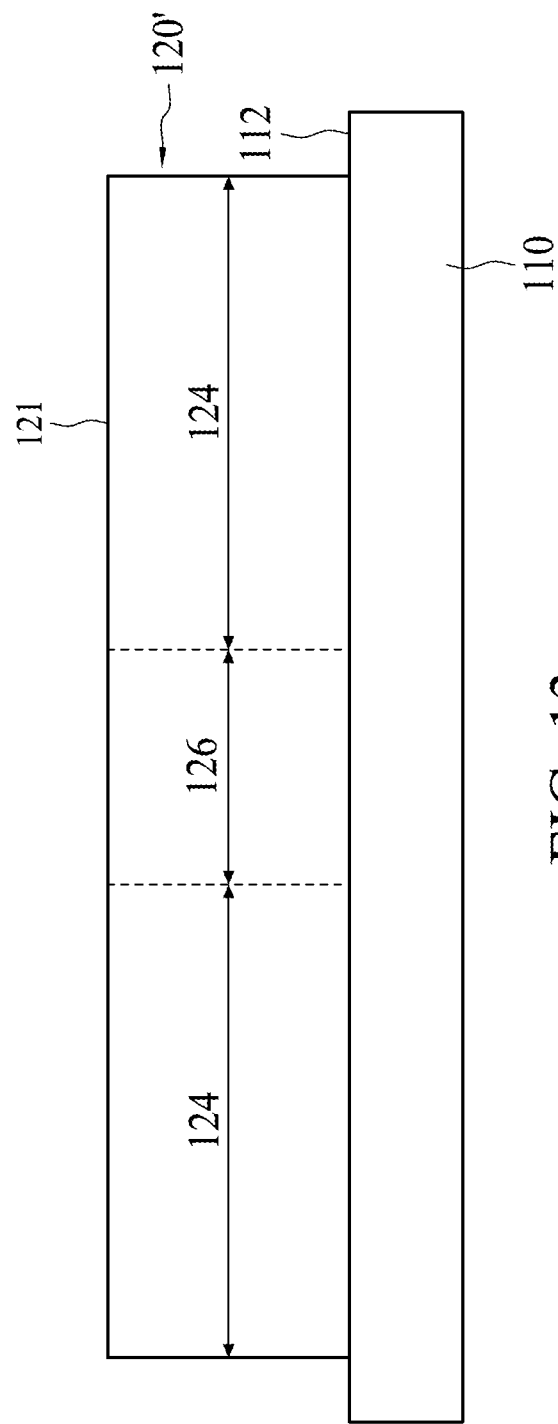
FIGS. 13 to 20 are schematic diagrams illustrating various fabrication stages constructed according to the method for manufacturing the semiconductor device in accordance with some embodiments of the present disclosure.

Referring to FIG. 13, in some embodiments, a semiconductor wafer 110 having one or more semiconductor structure 120' disposed thereon is provided according to step 202 shown in FIG. 12. The semiconductor structure 120' is disposed on a front surface 112 of the semiconductor wafer 110. Each of the plurality of semiconductor structure 120' includes a plurality of active areas 124 and a plurality of inactive area 126. In order to facilitate illustration of the present disclosure, only two active areas 124 and an inactive area 126 are depicted in the embodiment shown in FIGS. 13 to 20, and the inactive area 126 is disposed between the active areas 124.

Figure 14:
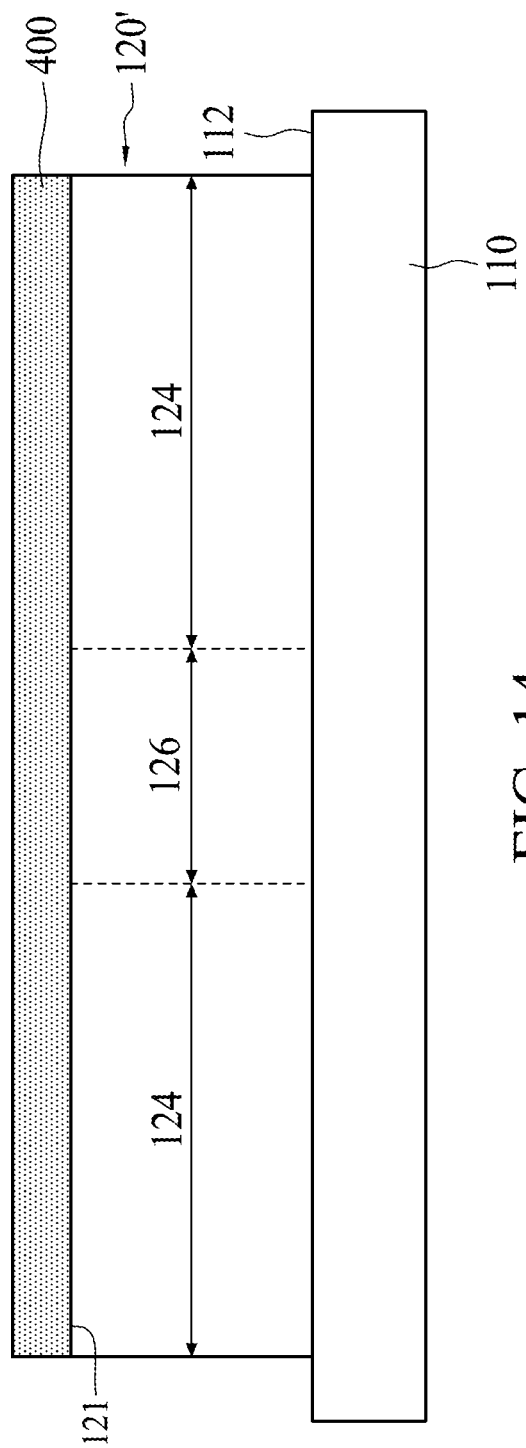
Figure 15:
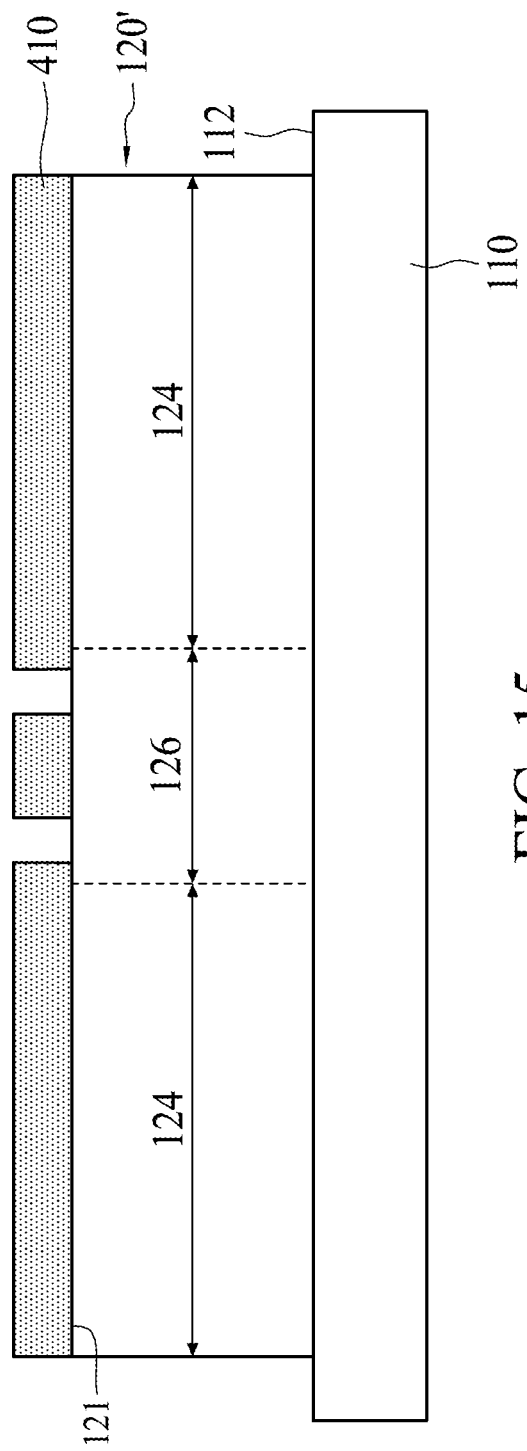

Referring to FIG. 14, in some embodiments, a photoresist layer 400 is provided over a top surface 121 of the semiconductor structure 120' according to a step 204 shown in FIG. 12. Referring to FIG. 15, in some embodiments, the photoresist layer 400 is patterned to from a pattern photoresist 410 according to a step 206 shown in FIG. 12. In some embodiments, the pattern photoresist 410 is formed by removing portion of the photoresist layer 400 in the inactive layer 126. In some embodiments, a portion of the top surface 121 is exposed to the patterned photoresist 410.

Figure 16:
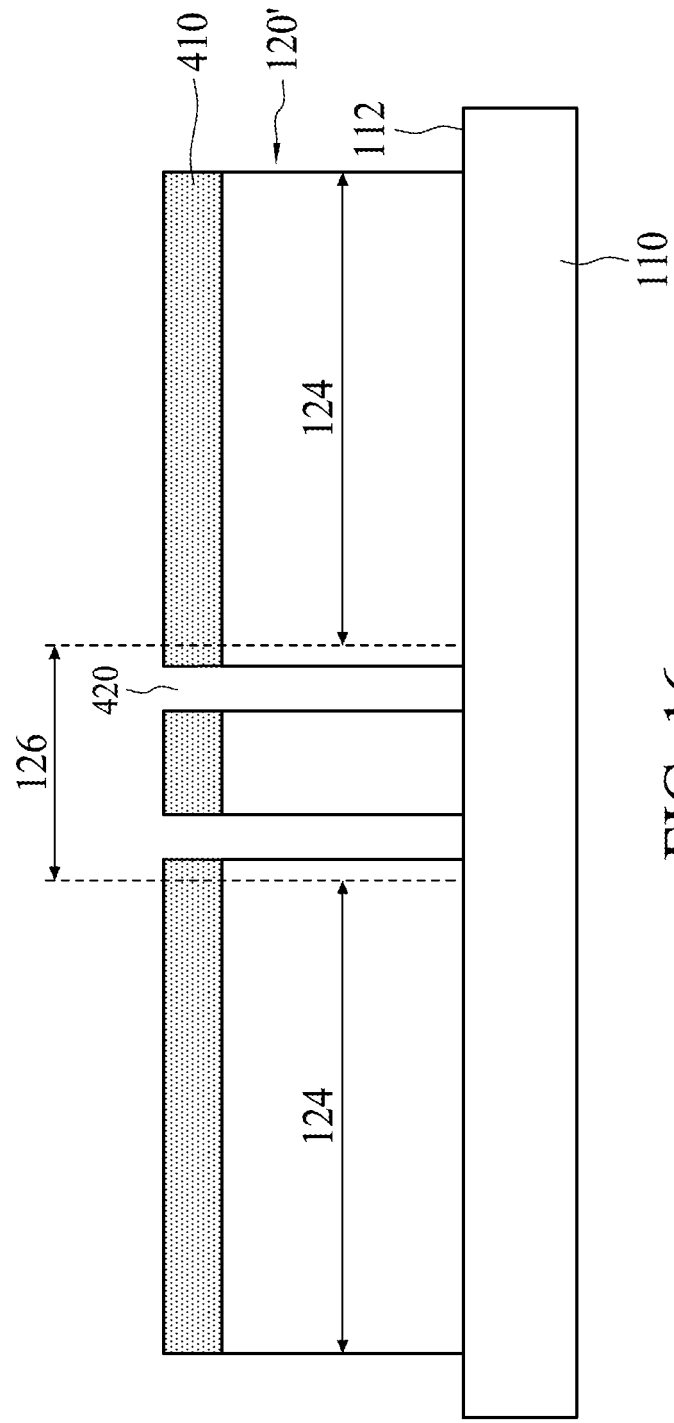
Figure 17:
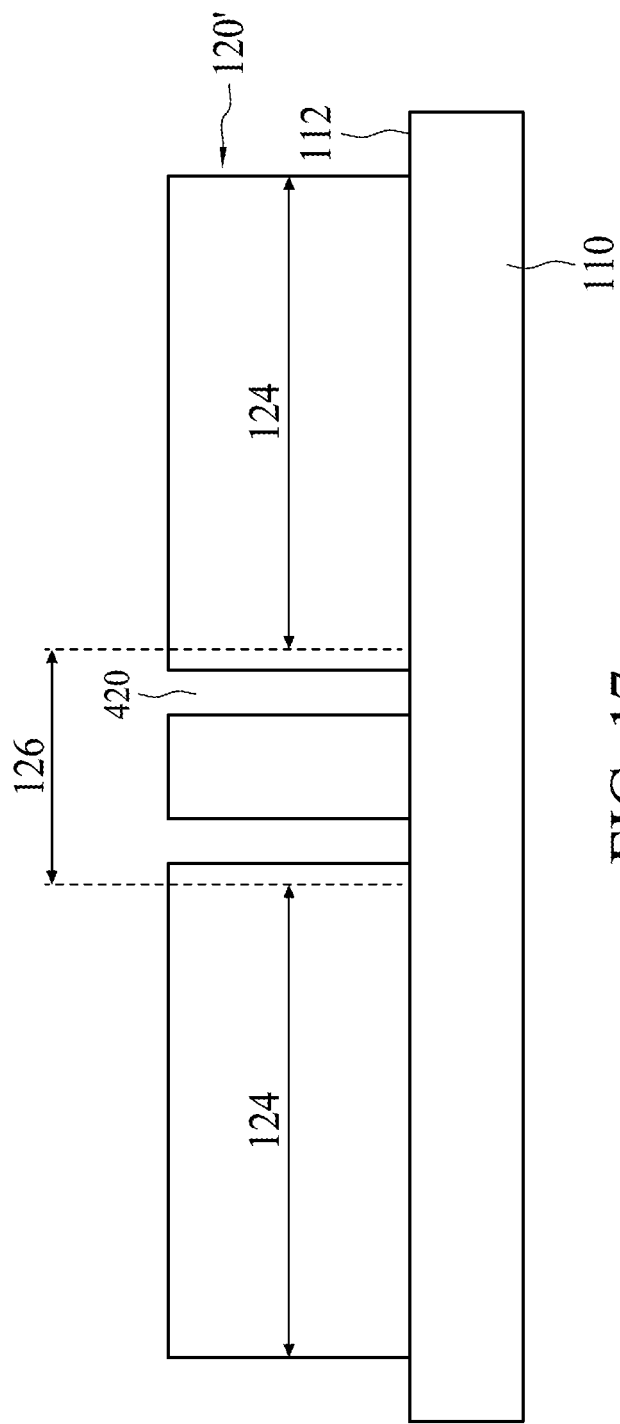

Referring, to FIG. 16, in some embodiments, an etching process is performed to form a plurality of openings 420 in the inactive area 126 according to a step 208 shown in FIG. 12. In some embodiments, portions of the semiconductor structure 120' in the inactive area 126 are etching away be using the patterned photoresist 410 as a mask. In some embodiments, portions of the semiconductor wafer 110 are exposed to the openings 420. The patterned photoresist 410 is then removed as shown in FIG. 17. In some embodiments, the openings are spaced from the active areas 124.

Figure 18:
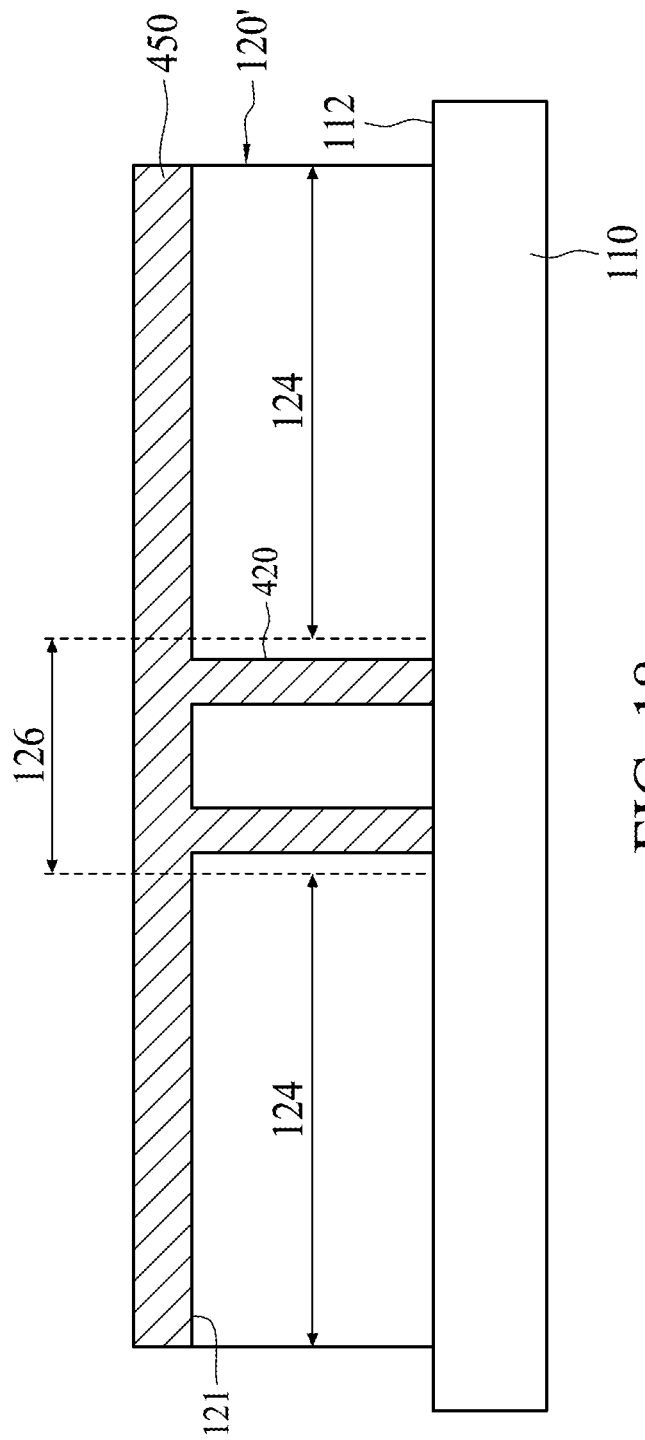

Referring to FIG. 18, in some embodiments, a protection layer 450 is formed on the top surface 121 of the semiconductor structure 120' and in the openings 420 according to a step 210 shown in FIG. 12. In some embodiments, the protection layer 450 has a thickness sufficient to fill the opening 420. In some embodiments, the protection layer 450 includes polyimide.

Figure 19:
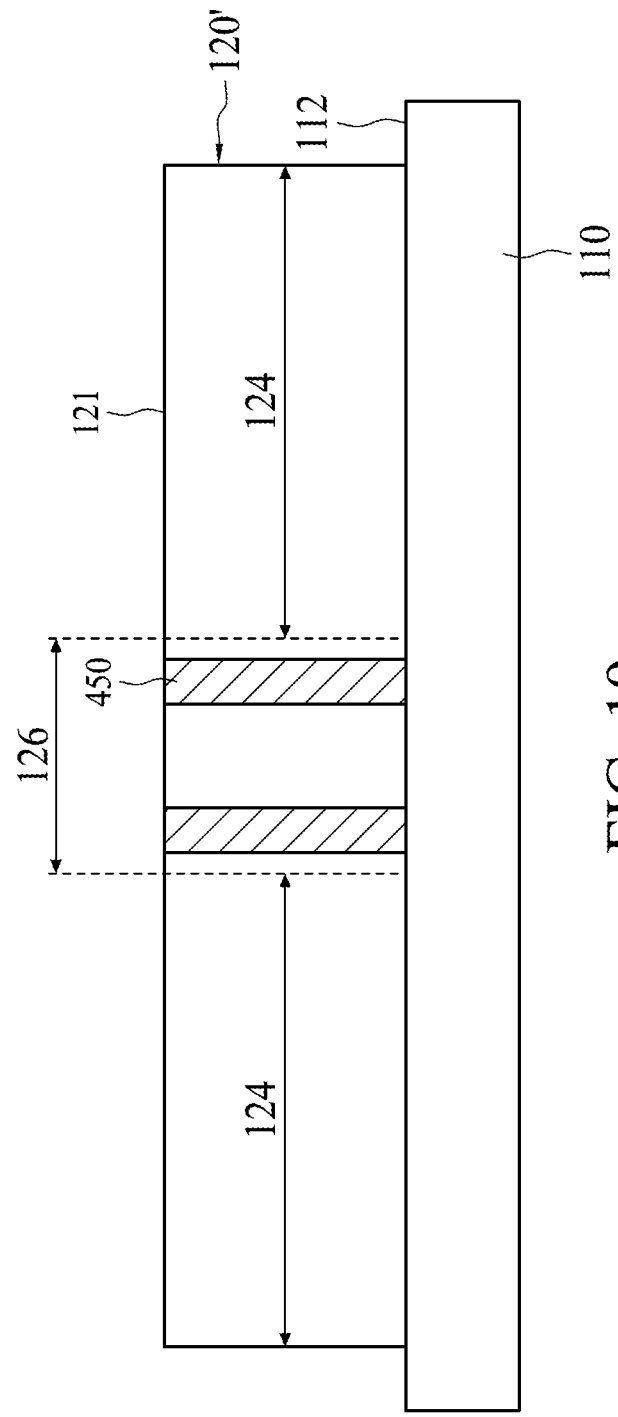

Referring to FIG. 19, in some embodiments, a portion of the protecting layer 450 is properly removed to expose the top surface 121 according to a step 212 shown in FIG. 12. In some embodiments, the portion of the protection layer 450 is removed by using a grinding process.

Figure 20:
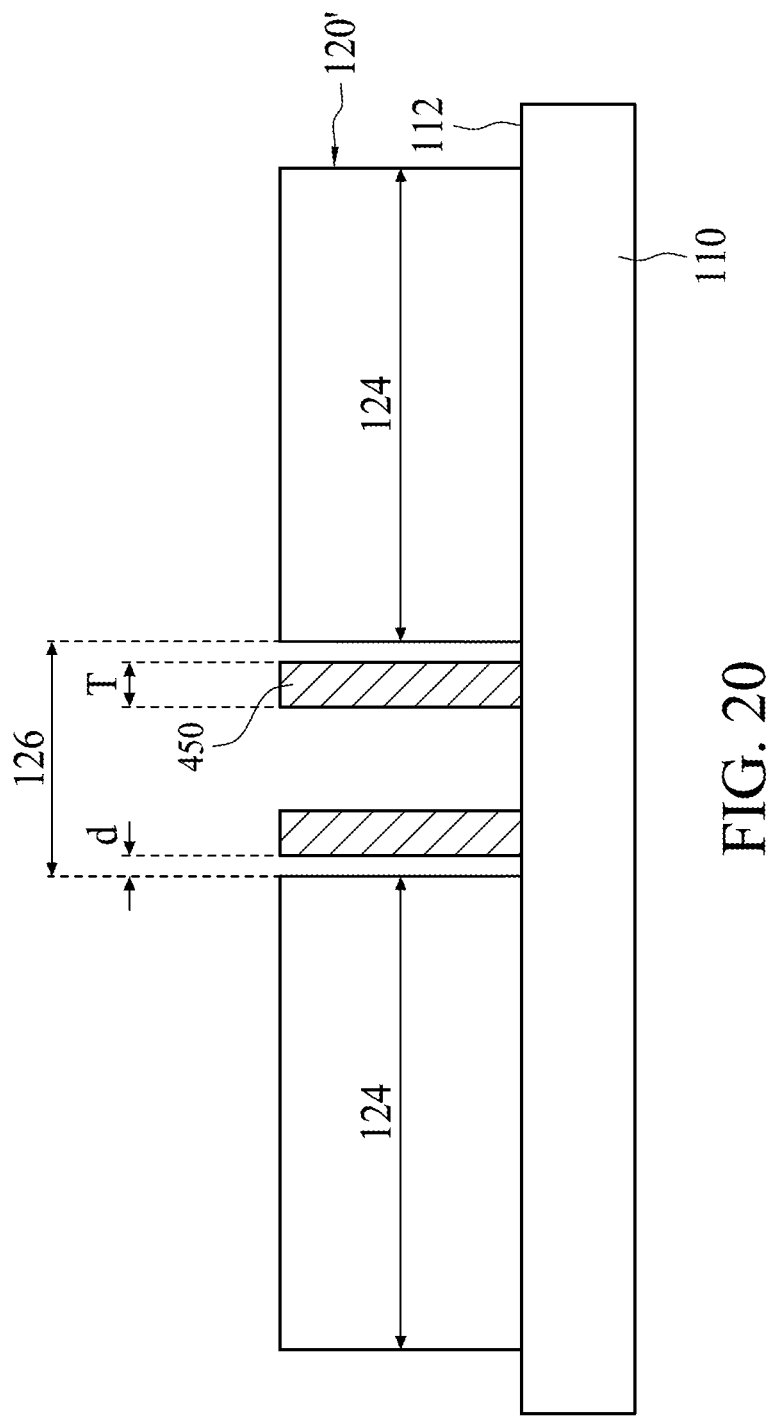

Referring to FIG. 20, in some embodiments, it is optional to remove the semiconductor structure 120' in the inactive area 124 to form the semiconductor device 100 according to a step 214 shown in FIG. 12. In some embodiments, a thickness T1 of the first protection dam 130 is substantially equal to 4 µm. In some embodiments, a distance d between the active area 129 and the protecting material 450 is equal to or less than 6 µm. In some embodiments, the distance d is not less than 1 µm.

In conclusion, with the configurations of the semiconductor device of the present disclosure, the corners and/or the sidewalls of the semiconductor chip are protected by the first protection dams and/or the second protection dams, thus preventing cracking of the semiconductor chip during the handling or assembly processes.

One aspect of the present disclosure provides a semiconductor device. The semiconductor device comprises a semiconductor wafer, a plurality of semiconductor chips, and a plurality of first protection dams. The semiconductor wafer has a plurality of functional regions separated by a plurality of vertical streets and a plurality of horizontal streets. The semiconductor chips are mounted on the functional regions, respectively. The first protection dams are disposed on the vertical streets and the horizontal streets and spaced from the semiconductor chips. A height of the first protection dam is not less than a height of the semiconductor chip.

One aspect of the present disclosure provides a method for manufacturing a semiconductor device. The mothed includes steps of providing a semiconductor substrate; providing a semiconductor structure on a surface of the semiconductor substrate, wherein the semiconductor substrate comprises a plurality of active area and a plurality of inactive area; forming a plurality of openings in the inactive areas, wherein the openings are spaced from the active areas; and filling a protection layer in the openings. Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a semiconductor wafer having a plurality of functional regions separated by a plurality of vertical streets and a plurality of horizontal streets in non-functional regions;
    a plurality of semiconductor chips located at the plurality of functional regions, respectively; and
    a plurality of first protection dams disposed on the plurality of vertical streets and the plurality of horizontal streets of the plurality of non-functional regions and spaced from the plurality of semiconductor chips, wherein the plurality of first protection dams are formed by polyimide;
    wherein the plurality of first protection dams are disposed at corners of the plurality of semiconductor chips, and wherein each of the plurality of first protection dams comprises:
        a vertical segment disposed on a vertical street;
        a horizontal segment disposed on a horizontal street; and
        an intersection segment disposed at an intersection point of the vertical segment and the horizontal segment;
    wherein the vertical segment and the horizontal segment are partially superposed with corresponding semiconductor chip as seen in side views of the semiconductor wafer; and
    wherein bottoms of the plurality of semiconductor chips and bottoms of the plurality of first protection dams are mounted on the semiconductor wafer at a same horizontal level, the plurality of first protection dams extend from the semiconductor wafer along sidewalls of the plurality of semiconductor chips to a height not less than a height of the plurality of semiconductor chips, whereby the plurality of first protection dams protect the sidewalls of the plurality of semiconductor chips and prevent cracking of the plurality of semiconductor chips.

2. The semiconductor device of claim 1, wherein a distance from a sidewall of a semiconductor chip to an outer surface of a first protection dam, away from the semiconductor chip, is less than 10 μm.

3. The semiconductor device of claim 2, wherein the distance from the sidewall of the semiconductor chip to the outer surface of the first protection dam, away from the semiconductor chip, is not less than 1 μm.

4. The semiconductor device of claim 3, wherein a thickness of the first protection dam is substantially equal to 4 μm.

5. The semiconductor device of claim 1, wherein the plurality of first protection dams surround the plurality of semiconductor chips, respectively.

6. The semiconductor device of claim 1, wherein the vertical segment, the horizontal segment, and the intersection segment are integrally formed.

7. A method for manufacturing a semiconductor device comprising:
    providing a semiconductor substrate;
    providing a semiconductor structure on a surface of the semiconductor substrate, wherein the semiconductor structure comprises a plurality of active area and a plurality of inactive area, which are disposed on the surface of the semiconductor substrate;
    forming a plurality of openings from a top surface of the semiconductor structure to the surface of the semiconductor substrate in the inactive areas, wherein portions of the semiconductor substrate are exposed to the plurality of openings and the plurality of openings are spaced from the active areas; and
    filling a protection layer in the plurality of openings, wherein the protection layer is formed by polyimide; and
    after filling the protection layer in the plurality of openings, removing portions of the semiconductor structure in the inactive areas so that the protection layer has an outer surface extending from the semiconductor substrate along sidewalls of the semiconductor structure to a height not less than a height of the semiconductor structure and is not in contact with the semiconductor structure in the active areas, whereby the protection layer protects the sidewalls of the semiconductor structure and prevent cracking of the semiconductor structure.

8. The method of claim 7, wherein the step of filling the protection layer in the plurality of openings comprises: depositing the protection layer in the top surface of the semiconductor structure and in the plurality of openings; and removing a portion of the protection layer to expose the top surface.

* * * * *